United States Patent
Wu

(10) Patent No.: US 6,534,405 B1
(45) Date of Patent: Mar. 18, 2003

(54) METHOD OF FORMING A MOSFET DEVICE FEATURING A DUAL SALICIDE PROCESS

(75) Inventor: Hua-Shu Wu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 15 days.

(21) Appl. No.: 09/967,700

(22) Filed: Oct. 1, 2001

(51) Int. Cl.[7] .................. H01L 21/338; H01L 21/336; H01L 21/4763; H01L 21/44
(52) U.S. Cl. .................. 438/682; 438/299; 438/303; 438/592; 438/596; 438/182
(58) Field of Search .................. 438/303, 305, 438/592, 307, 306, 299, 596, 595, 266, 287, 289, 182, 682, 630, 649

(56) References Cited

U.S. PATENT DOCUMENTS

| | | | | |
|---|---|---|---|---|
| 5,231,038 A | * | 7/1993 | Yamaguchi et al. | 438/303 |
| 5,232,861 A | | 8/1993 | Miwa | 438/366 |
| 5,275,960 A | * | 1/1994 | Yamaguchi et al. | 438/287 |
| 5,464,782 A | * | 11/1995 | Koh | 438/303 |
| 5,723,893 A | | 3/1998 | Yu et al. | 257/413 |
| 5,739,573 A | | 4/1998 | Kawaguchi | 257/384 |
| 5,770,464 A | * | 6/1998 | Ryou | 438/297 |
| 5,798,278 A | | 8/1998 | Chan et al. | 437/43 |
| 5,840,609 A | * | 11/1998 | Hyeon et al. | 438/299 |
| 5,891,783 A | * | 4/1999 | Lin et al. | 438/302 |
| 5,994,192 A | * | 11/1999 | Chen | 438/303 |
| 6,025,235 A | * | 2/2000 | Krivokapic | 438/289 |
| 6,100,173 A | | 8/2000 | Gardner et al. | 438/592 |
| 6,156,649 A | | 12/2000 | Hause et al. | 438/655 |
| 6,180,501 B1 | * | 1/2001 | Pey et al. | 438/592 |
| 6,218,276 B1 | | 4/2001 | Liu et al. | 438/596 |
| 6,261,935 B1 | * | 7/2001 | See et al. | 438/592 |
| 6,316,323 B1 | * | 11/2001 | Fang et al. | 438/305 |
| 6,436,746 B1 | * | 8/2002 | Chatterjee et al. | 438/183 |

FOREIGN PATENT DOCUMENTS

| | | | | |
|---|---|---|---|---|
| JP | 406097190 A | * | 4/1994 | |
| JP | 406120242 A | * | 4/1994 | |
| JP | 406163573 A | * | 6/1994 | |
| JP | 406267975 A | * | 9/1994 | |
| JP | 406333943 A | * | 12/1994 | |

* cited by examiner

*Primary Examiner*—Matthew Smith
*Assistant Examiner*—Chuong A Luu
(74) *Attorney, Agent, or Firm*—George O. Saile; Stephen B. Ackerman

(57) ABSTRACT

A method for fabricating a MOSFET device using a dual salicide formation procedure has been developed. The process features a first salicide formation procedure used to create a thick metal silicide component for a composite gate structure, with the composite gate structure in turn comprised with the overlying thick metal silicide shape, on an underlying polysilicon shape. The first salicide formation procedure also results in the formation of metal silicide protrusions, extending from the edges of the composite gate structure, overlying adjacent portions of an insulator layer. A novel feature of this invention is the use of the metal silicide protrusions as an etch mask, allowing definition of insulator spacers on the sides of the composite gate structure, to be defined from the underlying insulator layer. A second salicide formation procedure is subsequently employed to form a thin metal silicide layer only on a heavily doped source/drain region.

26 Claims, 3 Drawing Sheets

METHOD OF FORMING A MOSFET DEVICE FEATURING A DUAL SALICIDE PROCESS

BACKGROUND OF THE INVENTION (1) Field of the Invention

The present invention relates to methods used to fabricate semiconductor devices and more specifically to a method of fabricating a metal oxide semiconductor field effect transistor (MOSFET), device, featuring two individual salicide formation procedures, one for the gate structures and the another for the source/drain regions.

(2) Description of Prior Art

The advent of micro-miniaturization, or the ability to fabricate semiconductor devices using sub-micron features, has allowed performance increases, as well as reductions in the fabrication costs of the sub-micron devices, to be realized. The use of sub-micron features allow reductions in performance degrading parasitic capacitances to be achieved. In addition micro-miniaturization allows a greater number of smaller semiconductor chips to be obtained from a specific size starting substrate, still offering device densities of larger counterpart semiconductor chips, thus reducing the fabrication cost for a specific semiconductor chip.

MOSFET devices formed using sub-micron ground rules can however result in unwanted phenomena during specific fabrication procedures, such as the processes used to form self-aligned metal silicide (salicide), layers. These phenomena, observed with devices formed with sub-micron features are not present when forming MOSFET devices using larger features. First the narrow width of gate, or word line structures, necessitate the formation of thicker metal silicide regions to satisfy and equal the conductivity or performance objectives realized with wider word lines. A single salicide procedure used to form a desired thick metal silicide on the narrow word lines would also form the same thick metal silicide layer on the source/drain regions. Since the use of micro-miniaturization also features shallower depths, the formation of the thick metal silicide layer on the shallow source/drain region can result in unwanted leakage or shorts as a result of aggressive consumption of the shallow source/drain region. In addition the aggressive salicide formation procedure needed for thick layers on the gate or word line structures, in terms of increased metal thickness as well as increased formation temperature and time, can lead to gate to substrate shorts as a result of stringers, or metal silicide ribbons, forming on an insulator spacer, thus physically and electrically connecting the word line to the source/drain region.

This invention will describe a novel fabrication sequence in which a dual salicide process is used, where a first salicide formation procedure is used for formation of a thick metal silicide layer on the narrow width gate structures, and a second salicide formation procedure is employed to form a thinner metal silicide layer on the shallow depth source/drain regions. This invention will feature protection of the shallow source/drain region, during the first salicide formation procedure, via use of an overlying insulator layer. The same insulator layer is used for definition of insulator spacers, using a protruding portion of the thick metal silicide layer as an etch mask. Prior art, such as Gardner et al, in U.S. Pat. No. 6,100,173, as well as Hause et al, in U.S. Pat. No. 6,156,649, describe double salicide processes, however known of these prior arts describe the novel features described in the present invention, such as a first thick salicide formation on the word line structure with a portion of a salicide region extending over the adjacent insulator layer serving as a mask for definition of the underlying insulator spacers.

SUMMARY OF THE INVENTION

It is an object of this invention to fabricate a MOSFET device using a double salicide formation process, with a first salicide procedure used to form a thick metal silicide region on a narrow width, word line structures, while a second salicide process is used to form a thinner metal silicide layer on a shallow source/drain region.

It is another object of this invention to perform the formation of the thick metal silicide layer on a word line structure encased in an insulator layer, and to allow a portion of the thick metal silicide layer to extend, and overlay a portion of the top surface of the adjacent, encasing insulator layer.

It is still another object of this invention to use the extending portion of the thick metal silicide layer as an etch mask for definition of insulator spacers, via an anisotropic RIE procedure performed to the adjacent insulator layer.

In accordance with the present invention a double salicide formation procedure, used to form a thick, first metal silicide layer on a word line of a MOSFET device, and to form a thinner, second metal silicide layer on the source/drain region of the same MOSFET device, is described. After formation of a polysilicon gate, or word line structure, on a thin underlying silicon dioxide gate insulator layer, an insulator layer is deposited and polished back to expose the top surface of the polysilicon gate structure. After deposition of a first metal layer a first thermal procedure is employed to form a thick metal silicide layer on a bottom portion of the polysilicon gate structure via consumption of a top portion of the polysilicon gate structure, with the first thermal procedure also resulting in a thick metal silicide layer extension, located overlaying a top portion of the adjacent, planar insulator layer. After removal of the unreacted portions of the first metal layer, the thick metal silicide extensions are used as an mask to allow an anisotropic RIE procedure to form insulator spacers on the sides of the word line structure, now comprised with a top portion of thick metal silicide, and a bottom portion of unconsumed polysilicon. A second metal layer is then deposited followed by a second thermal procedure, used to form a self-aligned, thinner metal silicide layer on the exposed source/drain regions. This is followed by removal of unreacted portions of the second metal layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of fabricating a MOSFET device featuring a double salicide formation procedure, wherein a first salicide procedure is used to form a thick metal silicide layer on a narrow width, word line structure, and wherein a second salicide procedure is used to form a thinner metal silicide layer on a shallow source/drain region, will now be described in detail. A semiconductor substrate 1, comprised of P type, single crystalline silicon with a <100> crystallographic orientation, is used and shown schematically in FIG. 1. Isolation regions 2, also shown in FIG. 1, either shallow trench isolation (STI), or localized oxidized silicon (LOCOS), regions, are next formed. The insulator filled, STI regions are obtained via defining a shallow trench shape in the semiconductor substrate, deposition of a silicon oxide layer completely filling the shallow trench shape, then followed by removal of unwanted regions of the filling insulator layer via either CMP or selective RIE procedures. The LOCOS option is achieved via thermal oxidation of regions of the semiconductor substrate not covered by an oxidation resistant masking pattern, with the oxidation resistant material being silicon nitride. After formation of the LOCOS region the oxidation resistant pattern is selectively removed exposing the subsequent device region.

Figure 1:
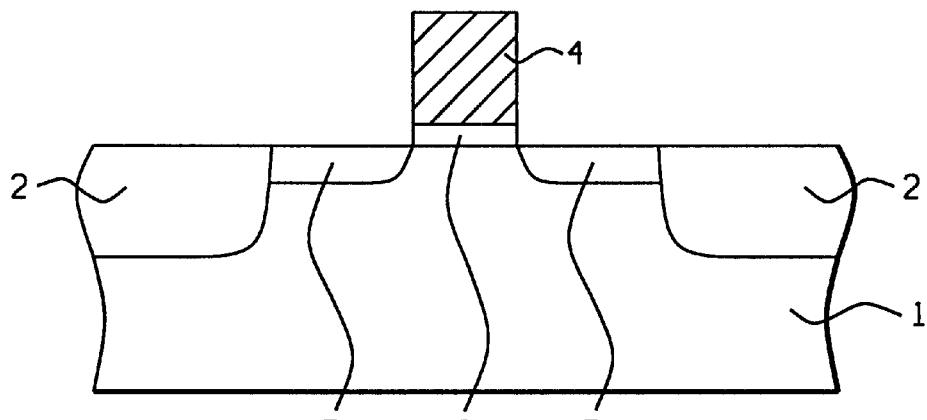
FIGS. 1–7, which schematically, in cross-sectional style, describe key stages of fabrication used to fabricate a MOSFET device, featuring a double salicide formation procedure, wherein a first salicide procedure is used to form a thick metal silicide layer on a narrow width, word line structure, and wherein a second salicide procedure is used to form a thinner metal silicide layer on a shallow source/drain region.

Silicon dioxide gate insulator layer 3, at a thickness between about 10 to 500 Angstroms, is next obtained via thermal oxidation procedures, performed in an oxygen—steam ambient. A polysilicon layer is then deposited via low pressure chemical vapor deposition (LPCVD), procedures, to a thickness between about 1000 to 4000 Angstroms. The polysilicon layer can either be doped in situ during deposition via the addition of arsine, or phosphine, to a silane ambient, or the polysilicon layer can be deposited intrinsically then doped via implantation of arsenic or phosphorous ions. A photoresist shape, (not shown in the drawings), is used as a mask to allow an anisotropic RIE procedure, using $Cl_2$ or $SF_6$ as an etchant, to define polysilicon gate, or word line structure 4. Polysilicon gate structure 4, shown schematically in FIG. 1, is comprised with a width between about 500 to 10000 Angstroms. Removal of the polysilicon gate defining photoresist shape is accomplished via plasma oxygen ashing procedures. Lightly doped source/drain (LDD), region 5, is next formed in regions of semiconductor substrate 1, not covered by polysilicon gate, or word line structure 4, via implantation of arsenic or phosphorous ions, at an energy between about 1 to 80 KeV, at a dose between about 1E12 to 2E14 atoms/$cm^2$. If desired the attainment of LDD region 5, can be performed post-insulator spacer formation, via implantation performed at an angle large enough to place the implanted ions under the insulator spacers. The result of these procedures are schematically shown in FIG. 1.

Figure 2:
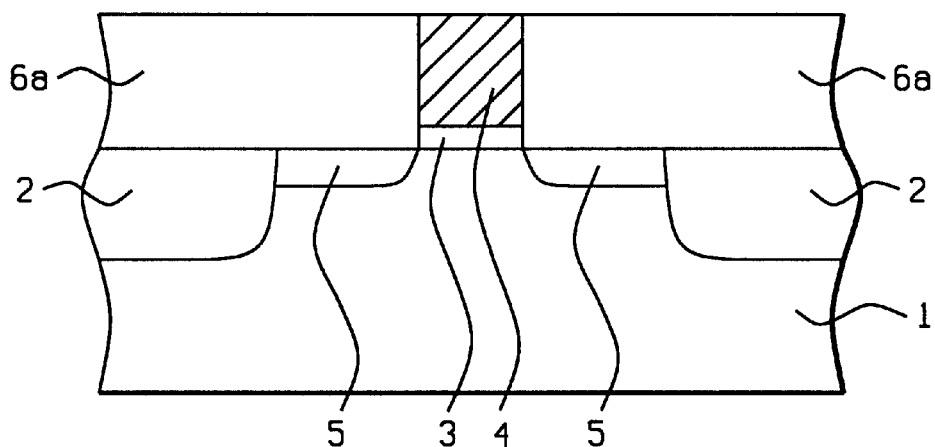

Insulator layer 6a, comprised of either silicon oxide or silicon nitride, is next deposited via LPCVD or via plasma enhanced chemical vapor deposition (PECVD), procedures, to a thickness between about 2000 to 6000 Angstroms. Planarization of insulator layer 6a, is next accomplished via a chemical mechanical polishing (CMP), procedure, resulting in the exposure of the top surface of polysilicon gate structure 6a. This is schematically shown in FIG. 2. If desired planarization of insulator layer 6a, and exposure of the top surface of polysilicon gate structure 4, can be accomplished via a selective RIE procedure using $CHF_3$ or $CF_4$ as an etchant for insulator layer 6a.

Figure 3:
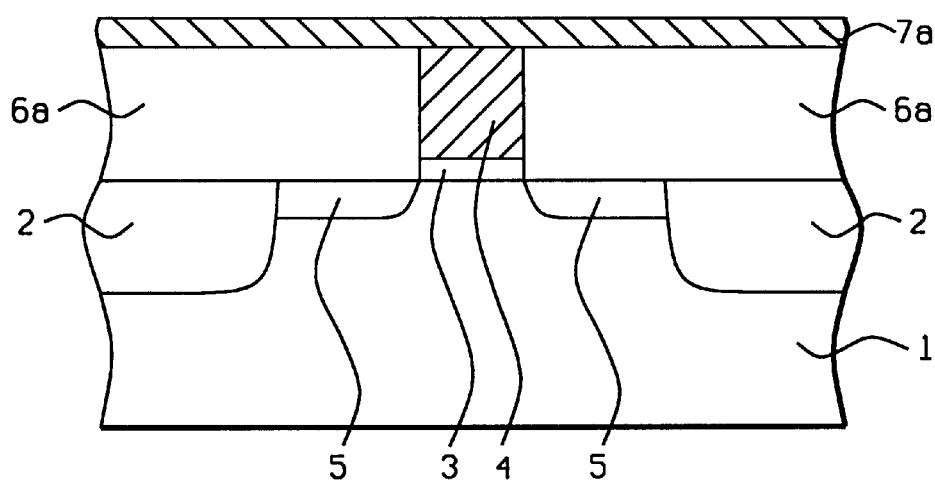
Figure 4:
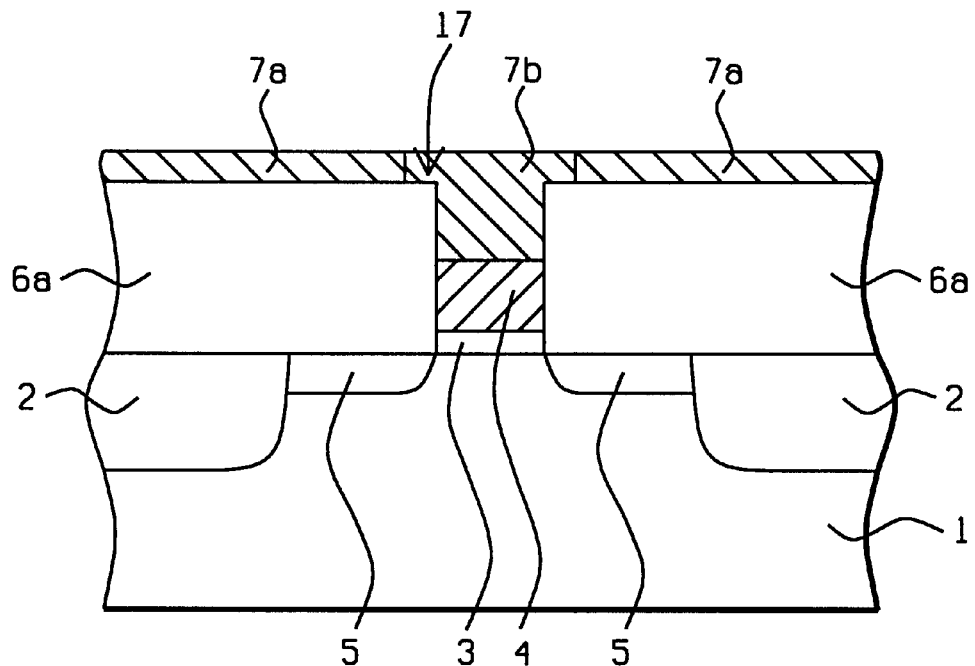

A metal layer 7a, such as titanium, is next deposited to a thickness between about 100 to 600 Angstroms, via plasma vapor deposition (PVD), procedures. This is schematically shown in FIG. 3. A first thermal procedure, or first salicide formation procedure, is then performed at a temperature between about 650 to 800° C., for a time between about 0 to 100 min, in a conventional furnace, to form a thick, first metal silicide shape 7b, at a thickness between about 200 to 1000 Angstroms, with the thick, first metal silicide layer being a titanium disilicide layer if metal layer 7a, is in fact a titanium layer. If desired, the first salicide formation can also be accomplished via use of rapid thermal anneal (RTA), procedures, performed at a temperature between about 800 to 950° C., for a time between about 0 to 1.0 min. The first salicide formation procedure results in consumption of a top portion of polysilicon gate structure 4, with the remaining bottom portion of polysilicon gate structure 4, now at a reduced thickness of between about 200 to 3500 Angstroms. The dominant diffusion species of the salicide formation is the movement, or diffusion of silicon, to reach the metal layer. Thus the first salicide formation procedure is performed for a length of time needed to intentionally form metal silicide extensions 17, now protruding from the edges located at the top word line structure, to a length between about 100 to 1500 Angstroms, overlaying the portion of insulator layer 6a, adjacent to composite gate, or word line structure. The remainder of metal layer 7a, overlying insulator layer 6a, furthest from the composite gate structure, remains unreacted. The composite gate, or word line structure, comprised of overlying metal silicide shape 7b, metal silicide extensions 17, and underlying polysilicon gate structure 4, is schematically shown in FIG. 4.

Figure 5:
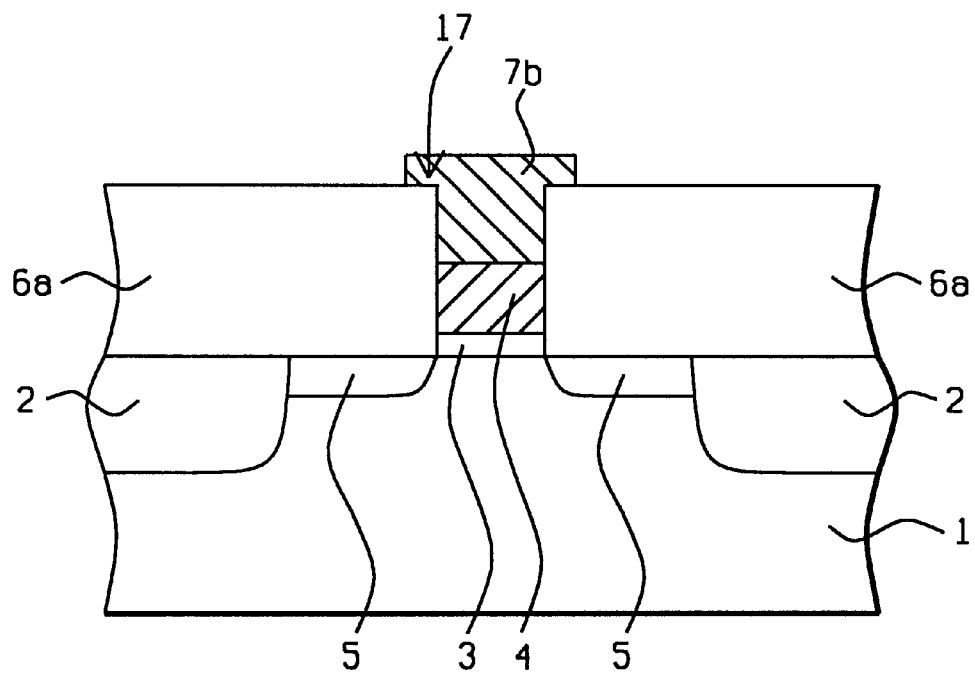
Figure 6:
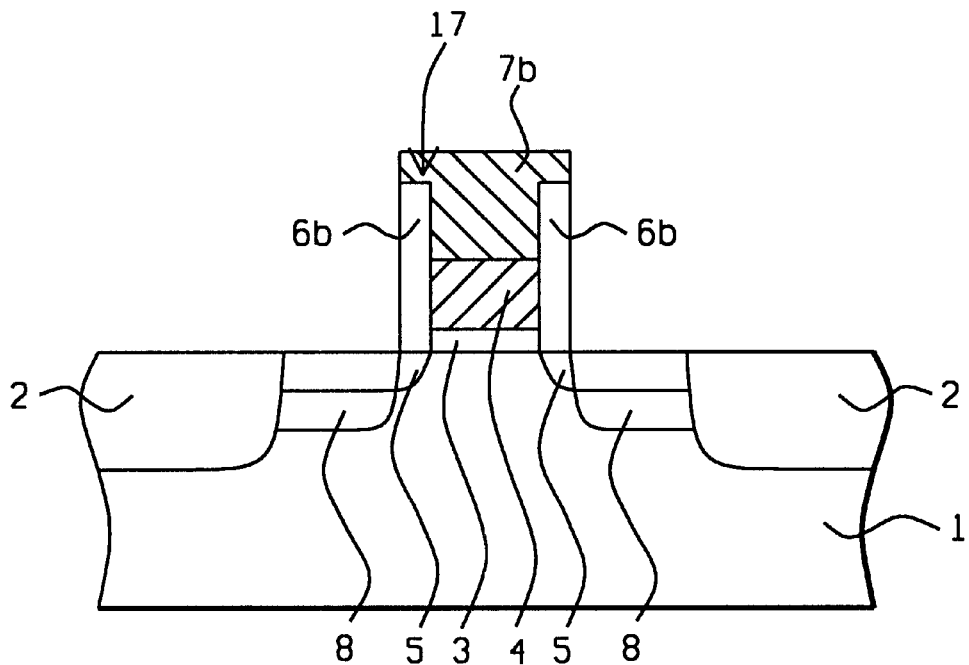

Removal of the unreacted portions of metal layer 7a, is next selectively accomplished using a solution comprised of $H_2SO_4$—$H_2O_2$—HCl—$NH_4OH$, at a temperature between about 50 to 100° C. The result of this procedure is schematically shown in FIG. 5. A critical feature of this invention is next practiced, the formation of insulator spacers 6b, located on the sides of the composite word structure. A selective, anisotropic RIE procedure, using $CHF_3$ as an etchant if silicon oxide is used as insulator layer 6a, (while $CF_4$ would be used as an etchant if silicon nitride is used as insulator layer 6a, is performed), is next performed using metal silicide extensions 17, as an etch mask, resulting in the definition of insulator spacers 6b, located on the sides of the composite word line structure. This is schematically shown in FIG. 6. Insulator spacers 6b, are comprised with a width between about 100 to 1500 Angstroms, identical to the length of metal silicide extensions 17. The formation of thick, first metal silicide shape 7b, performed prior to formation of insulator spacers 6b, and therefore still encased or surrounded by insulator layer 6a, prevented metal silicide ribbons from propagated over the insulator spacers, possibly reaching a source/drain region, where unwanted gate to substrate shorts or leakage would have resulted. In addition the ability to employ a robust first salicide formation procedure, without risk of gate to substrate shorts, allowed a thicker metal silicide layer to be formed, thus allowing the resistance of a narrow width, word line structure to be reduced. After definition of insulator spacers 6b, heavily doped source/drain region 8, is formed in a region of semiconductor substrate 1, not covered by the composite word line structure or by insulator spacers 6b, via implantation of arsenic or phosphorus ions, at an energy between about 5 to 80 KeV, at a dose between about 1E14 to 5E16 atoms/$cm^2$. This is schematically illustrated in FIG. 6.

Figure 7:
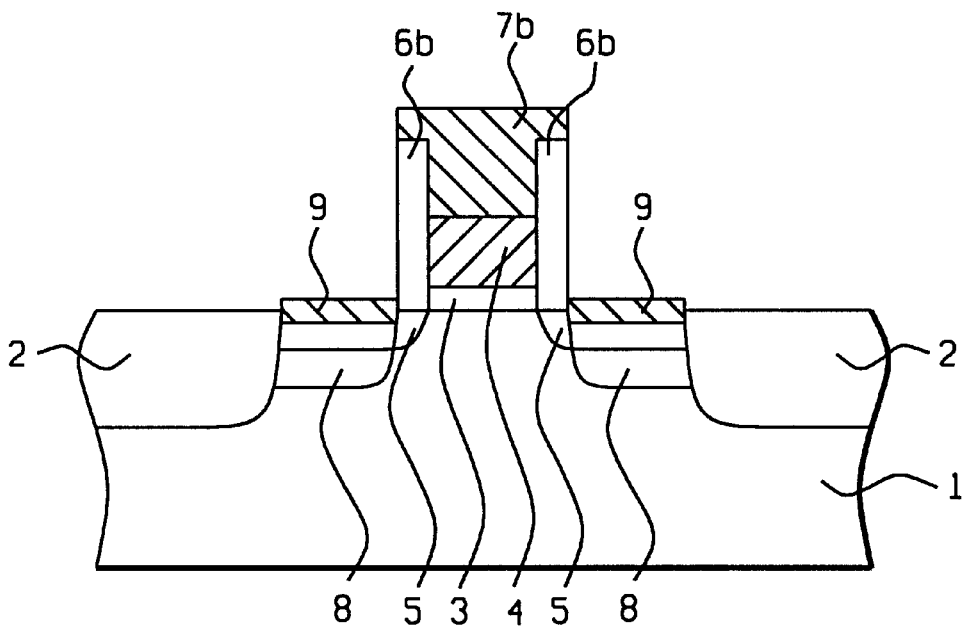

FIG. 7, schematically shows the formation of a thin, second metal silicide layer on the heavily doped source/drain region. Another metal layer such as titanium, (not shown in the drawings), is deposited via PVD procedures, to a thickness between about 100 to 400 Angstroms. A second salicide formation procedure is then performed, using a conventional furnace, at a temperature between about 650 to 850° C., for a time between about 0 to 100 min, to form a thin, second metal silicide layer 9, (a titanium disilicide layer if the metal layer used was titanium), at a thickness between about 100 to 600 Angstroms, on heavily doped source/drain region 8. If desired second salicide formation can be performed via RTA procedures, at a temperature between about 700 to 950° C., for a time between about 0 to 1.0 min. Portions of the unreacted metal layer, located on insulator spacers 6b, on isolation regions 2, and on the top surface of thick, first metal silicide shape 7b, are again selectively removed in a solution comprised of $H_2SO_4$—$H_2O_2$—HCl—$NH_4OH$, at a temperature between about 50 to 100° C. Due to the shallowness of heavily doped source/drain region 8, it was desirable to form a thin, metal silicide layer to limit the consumption of silicon and thus to prevent consumption of the shallow source/drain region. If only a single salicide procedure were used to form thick, metal silicide layer 7b, for both the word line structure as well as for the shallow, heavily doped source/drain region 8, it is possible that deleterious leakage or shorting phenomena might have occurred as a result of consumption of the shallow source/drain region.

Although this invention has been presented for an N channel, or NMOS device, it should be understood that it can also be applied to formation of a P channel, or PMOS device, via use of an N well region, and with formation of P type LDD, and P type heavily doped source/drain regions, formed in an area of the N well region not protected by an overlying gate structure, or by insulator spacers.

While this invention has been particularly shown and described with reference to the preferred embodiments thereof, it will be understood by those skilled in the art that various changes in form and details may be made without departing from the spirit or scope of the invention.

What is claimed is:

1. A method of forming a metal oxide semiconductor field effect transistor (MOSFET), device on a semiconductor substrate, comprising the steps of:

providing a polysilicon gate structure on an underlying gate insulator layer, with a lightly doped source/drain region located in an area of said semiconductor substrate not covered by said polysilicon gate structure;

depositing an insulator layer;

planarizing said insulator layer, exposing a top surface of said polysilicon gate structure;

depositing a first metal layer;

performing a first salicide formation procedure to form a first metal silicide layer via consumption of a top portion of said polysilicon gate structure, resulting in a composite gate structure comprised of said first metal silicide layer on a bottom portion of said polysilicon gate structure, and with said first salicide formation procedure also allowing formation of metal silicide protrusions extending from top portions of said composite gate structure, to overlay a portion of top surface of said first insulator layer;

performing an anisotropic dry etch procedure, using said metal silicide protrusions as an etch mask, to form insulator spacers on the sides of said composite gate structure;

forming a heavily doped source/drain region in an area of said semiconductor substrate not covered by said composite gate structure of by said insulator spacers;

depositing a second metal layer; and forming a second metal silicide layer on said heavily doped source/drain region.

2. The method of claim 1, wherein said insulator layer is a silicon nitride layer, obtained via LPCVD or PECVD procedures, at a thickness between about 2000 to 6000 Angstroms.

3. The method of claim 1, wherein said insulator layer is a silicon oxide layer, obtained via LPCVD or PECVD procedures, at a thickness between about 2000 to 6000 Angstroms.

4. The method of claim 1, wherein said first metal layer is a titanium layer, obtained via plasma vapor deposition (PVD), procedures to a thickness between about 100 to 600 Angstroms.

5. The method of claim 1, wherein said first salicide formation procedure is performed in a conventional firnace, at a temperature between about 650 to 800° C., for a time between about 0 to 100 min.

6. The method of claim 1, wherein said first salicide formation procedure is performed using rapid thermal anneal (RTA), procedures, at a temperature between about 800 to 950° C., for a time between about 0 to 1.0 min.

7. The method of claim 1, wherein said first metal silicide layer, is a titanium disilicide layer, at a thickness between about 200 to 1000 Angstroms.

8. The method of claim 1, wherein said metal silicide protrusions are titanium disilicide protrusions, extending between about 100 to 1500 Angstroms from the edge of said first metal silicide layer, and located overlaying a portion said insulator layer.

9. The method of claim 1, wherein said insulator spacers are formed to a thickness between about 100 to 1500 Angstroms, via said anisotropic dry etch procedure, using either $CHF_3$ or $CF_4$ as an etchant.

10. The method of claim 1, wherein said second metal layer is a titanium layer obtained via PVD procedures, at a thickness between about 100 to 400 Angstroms.

11. The method of claim 1, wherein said second salicide formation procedure is performed in a conventional furnace, at a temperature between about 650 to 850° C., for a time between about 0 to 100 min.

12. The method of claim 1, wherein said second salicide formation procedure is performed using rapid thermal anneal (RTA), procedures, at a temperature between about 700 to 950° C., for a time between about 0 to 1.0 min.

13. The method of claim 1, wherein said second metal silicide layer, is a titanium disilicide layer, at a thickness between about 100 to 600 Angstroms.

14. A method of fabricating a MOSFET device on a semiconductor substrate, featuring a thick titanium disilicide layer formed on a word line structure, and a thinner titanium disilicide layer formed on a source/drain region, comprising the steps of:

providing a polysilicon gate structure on an underlying silicon dioxide gate insulator layer, with a lightly doped source/drain region located in an area of said semiconductor substrate not covered by said polysilicon gate structure;

depositing an insulator layer;

performing a chemical mechanical polishing procedure to planarize said insulator layer and to expose a top surface of said insulator layer;

depositing a first titanium layer;

performing a first anneal procedure to form a thick titanium disilicide layer, via consumption of a top portion of said polysilicon gate structure, resulting in a composite gate structure comprised of said thick titanium disilicide layer on an underlying bottom portion of said polysilicon gate structure, and to form titanium disilicide protrusions extending from top edges of said composite gate structure, to overlay first portions of said insulator layer located adjacent to said composite gate structure, while other portions of said first titanium layer, located overlying second portions of said insulator layer, not adjacent to said composite gate structure, remain unreacted;

selectively removing unreacted portions said first titanium layer;

performing an anisotropic reactive ion etch procedure, using said titanium disilicide protrusions as an etch mask, to form insulator spacers located on the sides of said composite insulator layer;

forming a heavily doped source/drain region in an area of said semiconductor substrate not covered by said composite gate structure, or by said insulator spacers;

depositing a second titanium layer;

performing a second anneal procedure to form a thin titanium disilicide layer on said heavily doped source/drain regions, while portions of said thin titanium disilicide layer located on said insulator spacers, and on the top surface of said thick titanium disilicide layer, remain unreacted; and selectively removing unreacted portions said second titanium layer.

15. The method of claim 14, wherein said insulator layer is a silicon nitride layer, obtained via LPCVD or PECVD procedures, at a thickness between about 2000 to 6000 Angstroms.

16. The method of claim 14, wherein said insulator layer is a silicon oxide layer, obtained via LPCVD or PECVD procedures, at a thickness between about 2000 to 6000 Angstroms.

17. The method of claim 14, wherein said first titanium layer is obtained via plasma vapor deposition (PVD), procedures, to a thickness between about 100 to 600 Angstroms.

18. The method of claim 14, wherein said first anneal procedure used to form said thick titanium disilicide layer, and to form said titanium disilicide protrusions, is performed in a conventional furnace, at a temperature between about 650 to 800° C., for a time between about 0 to 100 min.

19. The method of claim 14, wherein said anneal procedure, used to form said thick titanium disilicide layer, and to form said titanium disilicide protrusions, is performed using rapid thermal anneal (RTA), procedures, at a temperature between about 800 to 950° C., for a time between about 0 to 1.0 min.

20. The method of claim 14, wherein said thick titanium disilicide layer is formed to a thickness between about 200 to 1000 Angstroms.

21. The method of claim 14, wherein said titanium disilicide protrusions extend between about 100 to 1500 Angstroms from the edge of said composite gate structure.

22. The method of claim 14, wherein said insulator spacers are formed to a thickness between about 100 to 1500 Angstroms, via said anisotropic reactive ion etch procedure, performed using either $CHF_3$ as an etchant if said insulator layer is comprised of silicon oxide, or performed using $CF_4$ as an etchant if said insulator layer is comprised of silicon nitride.

23. The method of claim 14, wherein said second titanium layer is obtained via PVD procedures, at a thickness between about 100 to 400 Angstroms.

24. The method of claim 14, wherein said second anneal procedure, used to form said thin titanium disilicide layer, is performed in a conventional furnace, at a temperature between about 650 to 850° C., for a time between about 0 to 100 min.

25. The method of claim 14, wherein said second anneal procedure, used to form said thin titanium disilicide layer, is performed using rapid thermal anneal (RTA), procedures, at a temperature between about 700 to 950° C., for a time between about 0 to 1.0 min.

26. The method of claim 14, wherein said thin titanium disilicide layer is formed to a thickness between about 100 to 600 Angstroms.

* * * * *